(12) United States Patent
Pirovano et al.

(10) Patent No.: US 6,443,041 B1
(45) Date of Patent: Sep. 3, 2002

(54) CARD EDGE CHAMFERING SYSTEM

(75) Inventors: Donato Pirovano, Vimercate; Luigi Penati, Carnate; Paolo Zogno, Pessano con Bornago, all of (IT)

(73) Assignee: International Business Machines Corporation, Armonk, NY (US)

( * ) Notice: Subject to any disclaimer, the term of this patent is extended or adjusted under 35 U.S.C. 154(b) by 37 days.

(21) Appl. No.: 09/604,204

(22) Filed: Jun. 27, 2000

(30) Foreign Application Priority Data

Feb. 26, 2000 (GB) ............................................... 0004476

(51) Int. Cl.[7] ................................................. B23B 3/06
(52) U.S. Cl. ................................ 82/56; 82/138; 82/173
(58) Field of Search .............................. 82/56, 55, 54, 82/173, 138; 409/138, 139, 140, 132, 301, 303; 83/432, 496, 497, 495, 869, 581, 676; 407/7

(56) References Cited

U.S. PATENT DOCUMENTS

| | | | | |
|---|---|---|---|---|
| 2,736,145 A | * | 2/1956 | Davidson | .................... 451/210 |
| 3,592,103 A | * | 7/1971 | Brown | ........................ 409/140 |
| 3,610,098 A | * | 10/1971 | Walker | ........................ 409/140 |
| 4,604,011 A | * | 8/1986 | Rungger et al. | ............ 409/138 |
| 4,616,966 A | * | 10/1986 | Ohyama | ...................... 409/132 |

FOREIGN PATENT DOCUMENTS

JP           11-262848           * 9/1999

* cited by examiner

*Primary Examiner*—Henry Tsai
(74) *Attorney, Agent, or Firm*—James A. Lucas; Driggs, Lucas, Brubaker & Hogg Co., LPA

(57) ABSTRACT

A milling system to be used in the manufacturing of electronic card for chamfering the edge of a card (e.g. a SIMM card) to facilitate its insertion in a socket on a board. According to a preferred embodiment of the present invention, the card to be chamfered (e.g. a SIMM card) is linearly moved within a milling system including two motor mills. The two mills are inclined with respect to each other forming an angle of about 90°. The card passes through the apex of this angle. The mills are mounted on a bracket system having a guide which guarantees the correct positioning of the milling system with respect to the card edge.

10 Claims, 2 Drawing Sheets

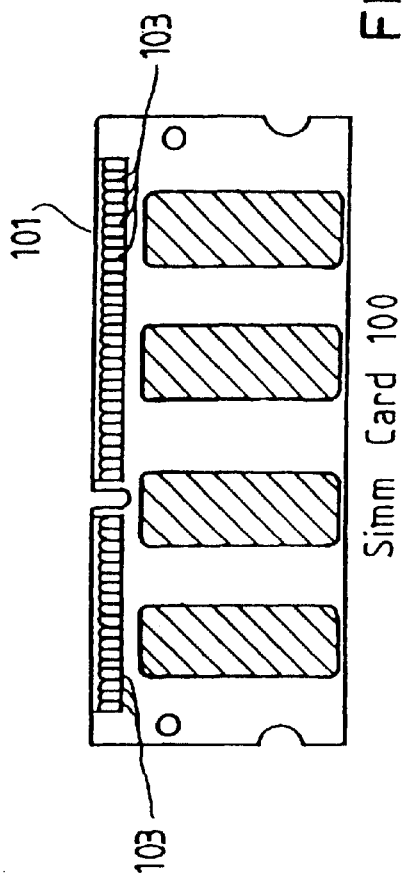
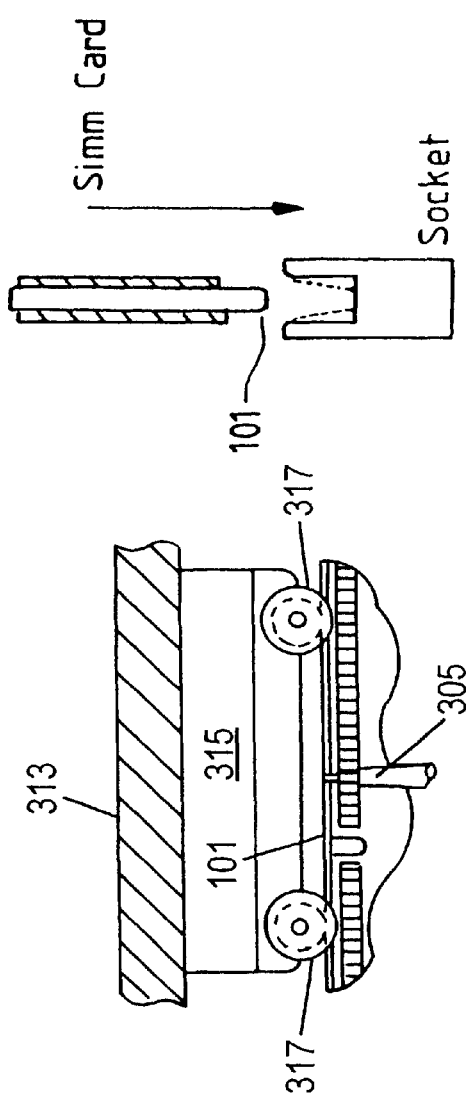
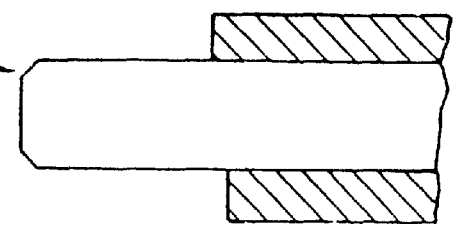
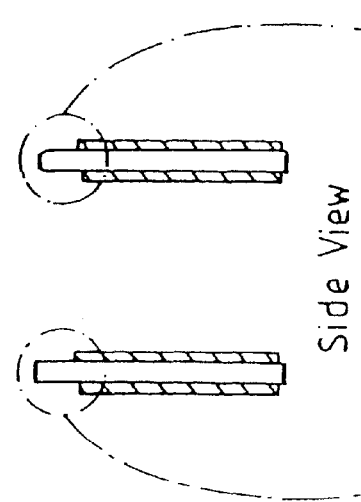

CARD EDGE CHAMFERING SYSTEM

TECHNICAL FIELD

The present invention relates to system for chamfering the edge of an electronic card and particularly to a milling system for chamfering the edge of a card (e.g. a SIMM card) to facilitate its insertion in a socket on a board.

BACKGROUND OF THE INVENTION

In the manufacturing process of electronic packages, the cards (e.g. a SIMM or DIMM card) are usually manufactured in panels of 10–12 pieces at a time and then cut into single cards. This cutting operation is usually done with a router cutting machine, i.e. a machine having a rotating blade. The sharp angles obtained with this cutting operation may cause problems when the card will be finally inserted in its socket on a board (e.g. a PC motherboard). Normally the card (e.g. a SIMM card) is pushed inside a connector to realise the electrical contacts and the connection between the card and the board. During the operation of insertion of the card, the corners rub and scratch against the socket. This friction between the materials can generate little particles (chips) from the sharp corners of the card. These particles are very dangerous because they could cause failures to the card, due to bad electrical contacts or short circuits inside the socket. FIG. 1 shows a SIMM card having a plurality of metal electric contacts 103 close to the edge 101, which is on the side to be inserted in the socket as shown by FIG. 1a. It would be advisable to have the card corners rounded off as shown in FIG. 2b to facilitate the insertion into the sockets and to avoid the friction problems caused by the sharp edges of the card (FIG. 2a).

A possible solution would be a manual milling operation. It should be immediately evident that this manual technique is very laborious and also not completely reliable, because of the human intervention. Furthermore, the interruption of the mechanical handling of the modules for the manual milling and refinement leaves open the eventuality of contamination during the waiting times and the handling of the modules.

On the other hand an automated milling operation is not easily possible, because of the precision required in order not to damage the electrical contacts close to the border.

SUMMARY OF THE INVENTION

It is an object of the present invention to provide a technique which overcomes the above drawbacks.

According to the present invention, we provide a milling system for chamfering an edge of an electronic card, the system comprising:

milling means for milling said card edge, the milling means including at least one couple of juxtaposed rotating mills, each mill having an axis of rotation forming an acute angle with the plane on which the card lies;

movable guide means for relatively positioning the milling means and the card, the guide means being coupled to said milling means and having a follower being in contact with the card edge during the chamfering operation to follow the card edge;

moving means for relatively moving the card and the milling means, the card passing through said at least one couple of mills.

BRIEF DESCRIPTION OF THE DRAWINGS

Various embodiments of the invention will now be described in detail by way of examples, with reference to accompanying figures, where:

FIG. 1 shows an example of SIMM card;

FIG. 2 shows the edge of a card before and after the chamfering operation according to a preferred embodiment of the present invention;

FIG. 4 is a partial side view of the preferred embodiment taken along line 4–4' of FIG. 3.

DETAILED DESCRIPTION OF THE PREFERRED EMBODIMENT

Figure 3:
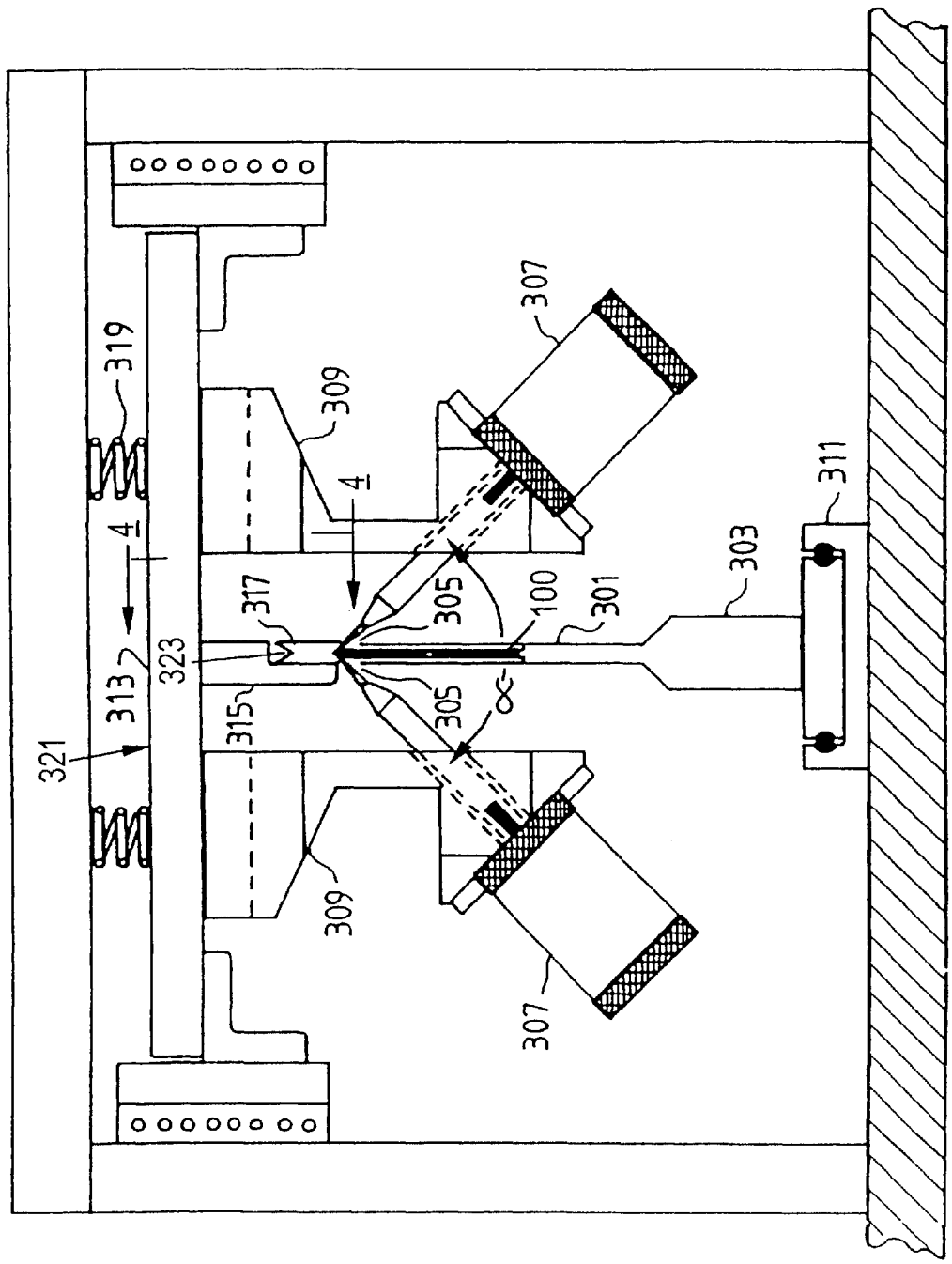
FIG. 3 schematically shows a front view of a preferred embodiment of the present invention.

According to a preferred embodiment of the present invention, a card 100 (e.g. a SIMM card) having an edge 101 with a plurality of electrical contacts 103 close to the edge (e.g. at a distance of about 0.1 mm) has its edge 101 chamfered by means of a couple of juxtaposed self-justing mills. FIG. 3 shows a preferred embodiment of the present invention. With reference to FIG. 3, the card 100 is placed on a bracket 301 on a movable support 303. Two mills 305 being rotated by two motors 307 are inclined with respect to each other, forming an angle α. The card passes through the apex of this angle while the mills rotate and chamfer the edge of the card on both sides. According to a preferred embodiment the particles produced by the milling operation are collected and eliminated by a vacuum system.

The two rotating mills 305 and their motors 307 are mounted on adjustable brackets 309 one facing the other and inclined at an angle α between them. According to a preferred embodiment of the present invention, the rotation axis of the two mills form an angle a of about 90°. Different inclinations can be used; in a preferred embodiment said angle α should be comprised between 60° and 120°. For angles less than 60° the mills could damage the metal contacts of the card, while with angles more than 120° the chamfering action would partially lose its efficacy. If a proper angle is chosen, the card can be chamfered even with the active devices already mounted on it. According to a preferred embodiment of the present invention, the card 100 passes between the rotating mills 305 and both sides of the card are exposed to the milling action and chamfered. According to a preferred embodiment of the present invention the two mills 305 are rotating in opposite senses, one clockwise, and the other anticlockwise. The speed of rotation of the mills, according to a preferred embodiment, is about 10,000 round per minute.

According to a preferred embodiment the two brackets 309 holding the motors 307 and the mills 305 are mounted on a cross-beam 313 having a central card guide block 315. The card guide block 315 includes follower means 317 which engages the edge 101 of the card to be chamfered. According to a preferred embodiment, the follower means 317 includes at least one disc having a v-shaped rim 323 which rolls on the edge 101. To better position the mills on the edge 101 the follower means should include two discs, one preceding and one following the rotating mills; the follower has also the effect of keeping the card in the correct position during the chamfering action. In a preferred embodiment, a spring 319 lightly keeps the whole system 321 (cross-beam 313, card guide block 315, follower 317, brackets 309, motors 307 and mills 305) pressed on the edge 101. According to a preferred embodiment, the brackets 309 are adjustable to allow a regulation in the depth of the chamfer action. The regulation of the brackets height and the spring pressure need to be very carefully calibrated to avoid any damage to the contacts 103 and to the card 100.

According to a preferred embodiment of the present invention, the card 100 is placed vertically, by means of bracket 301, on a support 303, which moves on a linear rail 311. The movement is made by means of a motor. The card 100 is moved at a constant speed through the inclined mills system and may pass two or more times between the mills. When the card 100 engages the follower 317, the whole system 321 is lifted, the mills come in contact with the edge 101 and start their chamfering action. The movable system 321 is self-adjusting, because it follows the height of the card, so that the mills are always positioned at the correct level independently from the height of the different cards. The result is that the depth of the chamfering is constant and can be exactly controlled.

According to a preferred embodiment of the present invention, a vacuum system is provided to immediately eliminate all the particles produced by the mills, in order to keep the working area and the mills clean during the chamfering process.

What is claimed:

1. A milling system for chamfering an edge of an electronic card, the system comprising:

milling means for milling said card edge, the milling means including at least one couple of juxtaposed rotating mills, each mill having an axis of rotation forming an acute angle with the plane on which the card lies;

movable guide means for relatively positioning the milling means and the card, including a follower to contact the card edge during the chamfering operation to follow the card edge, wherein the follower includes at least one rotational disc having a v-shaped rim, the guide means being coupled to said milling means; and moving means for relatively moving the card and the milling means, the card passing through said at least one couple of mills.

2. The system of claim 1 wherein the guide means further comprises resilient means for applying a pressure which forces the milling means against the card edge.

3. The system of claim 1 further comprising:

vacuum means for sucking the particles produced by the milling means during the chamfering action.

4. The system of claim 1 wherein said acute angle is between 30° and 60°.

5. The system of claim 4 wherein said angle is about 45°.

6. The system of claim 1 wherein the follower includes two discs, each having a v-shaped rim, one preceding and one following the rotating mills.

7. The system according to claim 1 wherein the mills rotate in opposite directions.

8. The system according to claim 1 further including springs to keep the system lightly pressed on the edge of the card.

9. The system according to claim 8 wherein the card is mounted to move on a linear rail at a constant speed between the mills.

10. The system according to claim 8 wherein the system is self adjusting to position the mills at the correct level depending on the height of the card.

* * * * *